(12) United States Patent
Bittner

(10) Patent No.: US 7,543,370 B2
(45) Date of Patent: Jun. 9, 2009

(54) METHOD FOR PRODUCTION OF A SUPERCONDUCTING MAGNETIC COIL

(75) Inventor: Gerhard Bittner, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/693,992

(22) Filed: Mar. 30, 2007

(65) Prior Publication Data

US 2008/0022506 A1 Jan. 31, 2008

(30) Foreign Application Priority Data

Mar. 31, 2006 (DE) .................. 10 2006 015 010

(51) Int. Cl.
*H01L 39/24* (2006.01)
(52) U.S. Cl. .................. 29/599; 29/592.1; 29/602.1; 29/605; 29/606; 324/300; 324/309; 324/318; 324/319; 324/320
(58) Field of Classification Search ............... 29/592.1, 29/599, 602.1, 605, 606; 324/300, 309, 318–322
See application file for complete search history.

(56) References Cited

U.S. PATENT DOCUMENTS 2,949,555 A 8/1960 Paul 5,212,271 A * 5/1993 Beckett et al. ............... 526/301
5,539,367 A * 7/1996 Xu et al. ...................... 335/301

FOREIGN PATENT DOCUMENTS

| JP | 02081406 A | | 3/1990 |
|---|---|---|---|
| JP | 02166705 A | | 6/1990 |
| JP | 02208240 A | * | 8/1990 |
| JP | 04091407 A | | 3/1992 |
| JP | 08118445 A | * | 5/1996 |
| WO | WO 03/069687 A1 | | 8/2003 |

OTHER PUBLICATIONS

Brochure of Hönle UV Technology, "UV—härtende Klebstoffe" (2004).
Specification Sheet "UV Klebstoffe" of Polytec PT.

* cited by examiner

*Primary Examiner*—Paul D Kim
(74) *Attorney, Agent, or Firm*—Schiff Hardin LLP

(57) ABSTRACT

In a method for production of a superconducting magnetic coil, winding of superconducting wires of the superconducting magnetic coil is implemented with at least one UV-curable plastic, and the UV-curable plastic is at least partially cured with UV light during the winding. A magnetic resonance apparatus has a superconducting magnetic coil that is produced according to this method.

20 Claims, 2 Drawing Sheets

METHOD FOR PRODUCTION OF A SUPERCONDUCTING MAGNETIC COIL

BACKGROUND OF THE INVENTION

1. Field of the Invention

The present invention concerns a method for production of a superconducting magnetic coil of the type used in a cryomagnet, in particular in a cryomagnet of a magnetic resonance apparatus. Furthermore, the invention concerns a magnetic resonance (MR) apparatus with such a magnetic coil.

2. Description of the Prior Art

Magnetic resonance apparatuses have been firmly established in medical imaging for some decades. Image data of a subject to be examined are acquired utilizing the phenomenon of magnetic resonance of atomic nuclei after the application of various magnetic fields, that are tuned as precisely as possible to one another in terms of their spatial and temporal characteristics.

One of these magnetic fields is a static, strong magnetic field with a field strength of typically 0.2 Tesla to 3 Tesla and more. In most cases this magnetic field is generated by a superconducting magnet. The windings of the superconducting magnetic coils are formed by superconducting wires. When the magnet is energized very large forces (Lorentz forces) that are proportional to the magnetic field act on the superconducting wires. These forces must be absorbed by the winding form (winding body) and the winding itself.

The slightest movements of a wire (which can occur upon energizing, but also afterwards) ultimately lead (by friction and also by the impact of the wire in its new rest position) to an energy feed that is for the most part converted into thermal energy. Due to the severely decreasing heat capacity of all substances at low temperatures, this quickly leads to a temperature increase over the critical temperature of the superconductor. This in turn leads to a quench in which the superconducting state of the magnetic coil collapses and ultimately also the magnetic field generated by the magnetic coil.

Upon the first startup of a superconducting magnet, such quenches (known as "training quenches") are deliberately provoked. When a wire has moved given an energizing (and thereby has caused a quench), the magnet will accept a higher field strength upon its next energizing (if the wire has occupied its ultimate position). In this manner the wires can be brought into their final position so that their position no longer changes upon subsequent energizings and de-energizings, and quenches are thereby no longer caused.

In order to achieve an optimally large fixing of the wires of the magnetic coil as well as to be able to cool the wires well, the windings of the superconducting coils have conventionally been sealed (potted) with epoxy resin. A number of problems occur with such a production of the magnetic coil.

Pure epoxy resin has a greater thermal coefficient of expansion than the superconducting wire (which is formed essentially of copper), such that upon cooling to the operating temperature of the magnet (4.2 to 10 Kelvin) it exhibits many cracks and thus loses much of its mechanical stability. For example, upon cooling to helium temperature, epoxy resin shrinks by 10 tenths of a percent and copper shrinks by 3 tenths of a percent. In magnetic coils that are sealed with pure epoxy resin, the probability thus increases that they will repeatedly quench upon subsequent energizings. Moreover, the forces acting on the wire (Lorentz forces) are less well absorbed by the wire than in the case of a crack-free sealing material. The forces must primarily be absorbed by a stable (and thus expensive) winding form.

The thermal coefficient of expansion of the epoxy resin can be conformed to that of copper by the admixture of powdered filler material (for example quartz sand), such that the crack formation is at least significantly reduced. The probability that the magnet will quench upon energizing is thereby reduced and the coil form can be retained (mounted) less rigidly because the winding itself can absorb a portion of the Lorentz forces.

If the windings are sealed only with filled epoxy resin after the fabrication thereof, it is possible for the filler material to be filtered out by the narrow gaps in the winding, such that inner regions of the winding are embedded only in epoxy resin without filler material, so (as described above) the stability of the winding is reduced. Upon a subsequent sealing of the winding with a filled epoxy resin, the filler material must therefore exhibit a relatively small grain size (typically one tenth up to one third of the typical wire spacing) and the winding may additionally not include too many layers, so that inner (interior) layers still also receive sufficient filler material. This means that all regions of the winding may not have a sufficient stability, with the disadvantages described above.

Another method with which the filtering out of the filler material is avoided is known as "wet winding". During winding, filled epoxy resin is applied with an applicator and/or a spatula so that filled epoxy resin is located at each point of the windings. This method has the disadvantage that a contamination of the work space (for example of the winding machine) by dripping epoxy resin occurs. Thickening or curing times of the epoxy resin must additionally be taken into account, which extends the manufacturing process.

Both methods exhibit further disadvantages. The wires must be wound on a stable coil form since the stability is obtained only through the curing of the epoxy resin. For this reason it has conventionally been very time-consuming (and thus uneconomical) to produce a larger self-supporting winding with the wet winding method, since the curing requires a certain time, so the production workflow is significantly lengthened. The described problems lead to increased production costs, so the manufacturing costs for a magnetic resonance apparatus with a superconducting magnetic coil also increase.

SUMMARY OF THE INVENTION

An object of the present invention is to provide a cost-effective and fast method for manufacturing of a superconducting magnetic coil in which only a minimal contamination of the work space occurs. Furthermore, it is the object of the invention to provide a magnetic resonance apparatus that is cost-effective to produce.

The above object is achieved in accordance with the invention by a method for production of a superconducting magnetic coil wherein winding of superconducting wires of the superconducting magnetic coil is implemented with at least one UV-curable plastic, so the UV-curable plastic is at least partially cured with UV light during the winding.

With this method, the curing of the plastic in which the winding of the superconducting coils is embedded is accelerated by the UV light in comparison to conventional production methods. In this manner the curing of the plastic can be specifically controlled. In comparison to typical wet winding methods in which dripping plastic can contaminate the work space such that the accounting for thickening and curing times extends the workflow, a first curing of the UV-curable plastic can be controlled in a targeted manner such that the UV-cured plastic no longer drips but still retains its tackiness to the extent necessary to allow the layers to bond to one another. After production of the winding a final curing (in particular of the edge layers) can be achieved by irradiation of the winding with UV light.

The targeted control of the curing of the UV-curable plastics facilitates automation of the workflow, which has a direct advantageous effect in assembly line productions and which expands the possibilities of the quality control during the production.

Furthermore, compared with previously-used plastics, UV-curable plastics are largely solvent-free and therefore are environmentally compatible to a high degree. UV-curable plastics can, be obtained, for example, from the company Polytec PT GmbH, Waldbronn, Germany or from the company Hönle AG, Munich, Germany.

The at least one UV-curable plastic is advantageously a UV-curable epoxy resin since epoxy resins, due to their mechanical properties, are suitable for embedding the winding and for the coil insulation (isolation) of a cryomagnet.

The at least one UV-curable plastic is preferably a plastic filled with a filler material. These plastics are characterized by a particularly advantageous shrinking behavior in comparison to the superconducting wire upon cooling.

In one embodiment the winding is produced using a reusable winding spindle. This type of self-supporting winding is only enabled via the use of UV-curable plastics, since the stability needed in the production of a self-supporting winding can be achieved only through the targeted curing of the plastic. In magnetic coils that are produced as self-supporting windings, the coil form (that was required in previously-used winding methods in order to support and to stabilize the wires and the liquid plastic) is omitted.

In another advantageous embodiment, the winding is produced using a coil form (or former). The coil form must be designed to be very stable in conventional methods, since it must absorb almost the entirety of the Lorentz forces, but in accordance with the invention the coil form can be fashioned lighter and more cost-effectively, since a portion of the Lorentz forces can be absorbed by the winding.

In preferred embodiments the UV light is generated by a UV laser and/or a UV lamp. The use of a UV lamp enables a simultaneous curing of larger regions; by contrast the use of a UV laser enables a targeted curing of specific regions that can be cured faster due to the higher intensity of the UV laser.

The curing of the UV-curable plastic can ensue at different speeds in different regions of the magnetic coil during curing of the superconducting wires. Regions that must immediately be stable in the winding process (such as, for example, border regions) can be cured quickly in this manner while middle regions, in which a good connection of individual winding layers is necessary, are cured slower.

At least two different types of UV-curable plastics are advantageously used. In regions of the winding in which different requirements for the stability exists, a UV-curable plastic adapted to these requirements is used. For example, border regions and middle regions of a winding must be differently stable. These different requirements can be satisfied by the use of different types of UV-curable plastics.

In an embodiment this is achieved by the different types of UV-curable plastics differing in terms of their curing times. For example, rapidly curing plastics can be used in border regions since these regions should cure quickly in order to give the winding the necessary stability. In contrast to this, slower-curing UV plastics can be used in middle regions. These plastics retain a certain thickness for a longer time so that the different layers of the winding bond particularly well.

In a further embodiment, the at least two different types of UV-cured plastics are UV-curable plastics with different filler materials. The filler material, particularly the grain size of the filler material, is adapted to the geometry and the desired spacing of the wires.

The superconducting magnetic coil is advantageously a superconducting magnetic coil of a magnetic resonance apparatus.

The inventive magnetic resonance apparatus uses a superconducting magnetic coil that is produced according to a method described above.

DESCRIPTION OF THE PREFERRED EMBODIMENT

Figure 1:
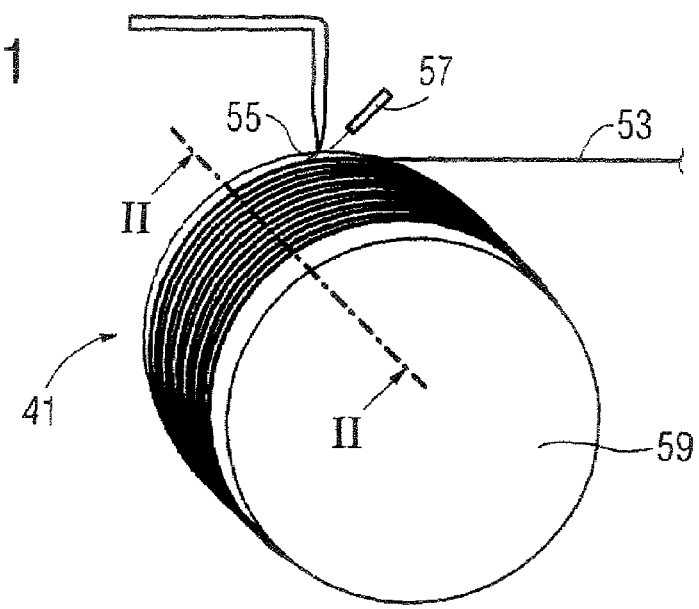
FIG. 1 illustrates a magnetic coil in a production process according to the inventive method, in which the magnetic coil is wound on a coil form.

FIG. 1 illustrates the production of a magnetic coil 41 according to the inventive method. The wire 53 from which the magnetic coil 41 is wound is formed of superconducting material, for example a niobium-titanium alloy in a copper cladding or jacket. Up to multiple kilometers of wire 53 are processed in the winding of a magnet 41.

In the inventive method the superconducting wires 51 are wound together with a UV-curable plastic 55 that is cured during the winding with UV light (which here is generated by a UV laser 57). The UV-curable plastic 55 is preferably a UV-cured epoxy resin.

Also shown is a coil form 59 on which the wire 53 is wound and that later is a component of the magnetic coil 41. Conventionally the coil form must be executed relatively stably in conventional methods since it must support and stabilize the wire together with a still-wet plastic, and since it must often absorb a majority of the Lorentz forces. In accordance with the invention a lighter and more cost-effective coil form 59 can be used since the necessary stability of the winding during the production is ensured by the UV-curable plastic 55 due to its immediate curing.

Alternatively, instead of the coil form 59, a reusable winding spindle can be used from which the self-supporting wound magnetic coil 41 is removed after production.

Figure 2:
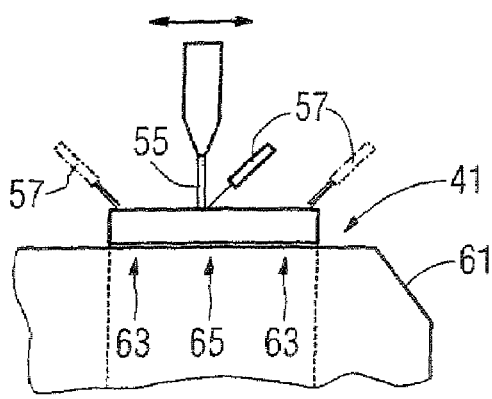
FIG. 2 is a cross-section through a magnetic coil that is wound in a self-supporting manner according to the inventive method, in the production of which a UV-curable plastic is cured with different speeds in different regions.
Figure 3:
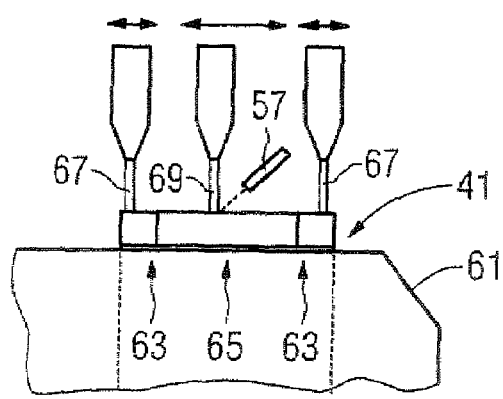
FIG. 3 is a cross-section through a magnetic coil produced using UV-curable plastics with different curing times.
Figure 4:
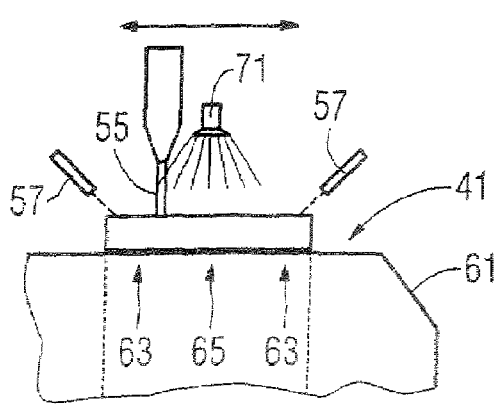
FIG. 4 is a cross-section through a magnetic coil, with a UV light being generated both by a UV laser and by a UV lamp.

FIGS. 2 through 4 respectively show cross-sections through the winding of a magnetic coil 41 during production, the magnetic coil 41 being wound in a self-supporting manner on a winding spindle 61. The cross-section corresponds to a cross-section through the magnetic coil 41 of FIG. 1 along the dashed line II-II.

FIG. 2 shows the cross-section of a magnetic coil 41 in which the wires 53 are wound with a UV-curable plastic 55. The UV-curable plastic is exposed with higher intensity via the UV laser 57 given the winding of the border regions 63 than given the winding of the middle region 65. This causes a faster curing of the UV-curable plastic 55 in the border regions 63, so the border regions 63 are relatively quickly protected from slippage during the winding of the remaining regions.

By contrast, during the winding of the middle region 65 the intensity of the UV laser 57 is decreased so that the UV-cured plastic 55 is still somewhat tacky during the winding of the next layer, but no longer drips. A particularly good bonding of the individual winding layers to one another thereby results.

A similar effect with two UV-curable epoxy resins 67, 69 curing at different speeds is achieved in the cross-section shown in FIG. 3

The border region 63 is wound with a UV-curable epoxy resin 67 that exhibits a short curing time, such that the border region 63 rapidly achieves the necessary stability that protects it from a slippage. A further UV-curable epoxy resin 67 that exhibits a longer curing time is used given the winding of the middle region 65, such that a layer is still somewhat tacky during the winding of the next layer. A particularly stable bonding between the individual layers thereby results.

A similar effect is achieved in the cross-section shown in FIG. 4 by the combined use of a UV lamp 71 and a UV laser 57.

The UV lamp 71 generates UV light with relatively lower intensity to provide the relatively slow curing of the UV-curable plastic 55 during the winding of the middle region 65. During the winding of the border regions 63 a UV laser 57 is additionally used so that the border regions 57 cure quicker.

Figure 5:
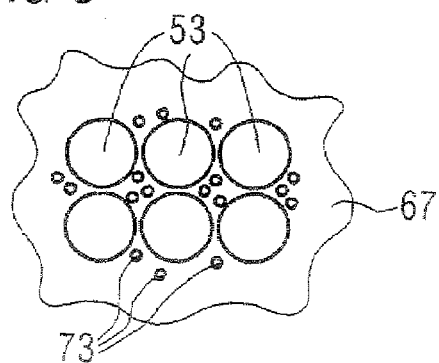
FIG. 5 is a cross-section through individual windings of a magnetic coil that are surrounded by a filled epoxy resin with filler material that exhibits a relatively coarse granularity (grain size).

FIG. 5 shows an enlarged section from a cross-section through a winding. Individual wires 53 that are embedded in a filled UV-curable epoxy resin 67 are visible.

The problem of the filler material being filtered out by the wires 53 lying close to one another is avoided by the filled UV-curable epoxy resin 67 being directly applied with the winding of the individual wires 53. If, for example, fine quartz sand is used as a filler material, significant limitations with regard to the grain size of the filler material 73 are present in conventional winding methods. Given a subsequent immersion of the winding in liquid epoxy resin, the filler material 73 must exhibit a comparably small grain size so that it is not filtered out upon the immersion and thus causes an unwanted severe shrinking of the epoxy resin. These limitations do not exist in the inventive winding method since the UV-curable epoxy resin 67 is simultaneously wound with the wires 53. The filler material 73 reaches in the interstices even given a tight winding, such that the shrinking behavior of the UV-cured epoxy resin 67 is advantageously influenced.

Figure 6:
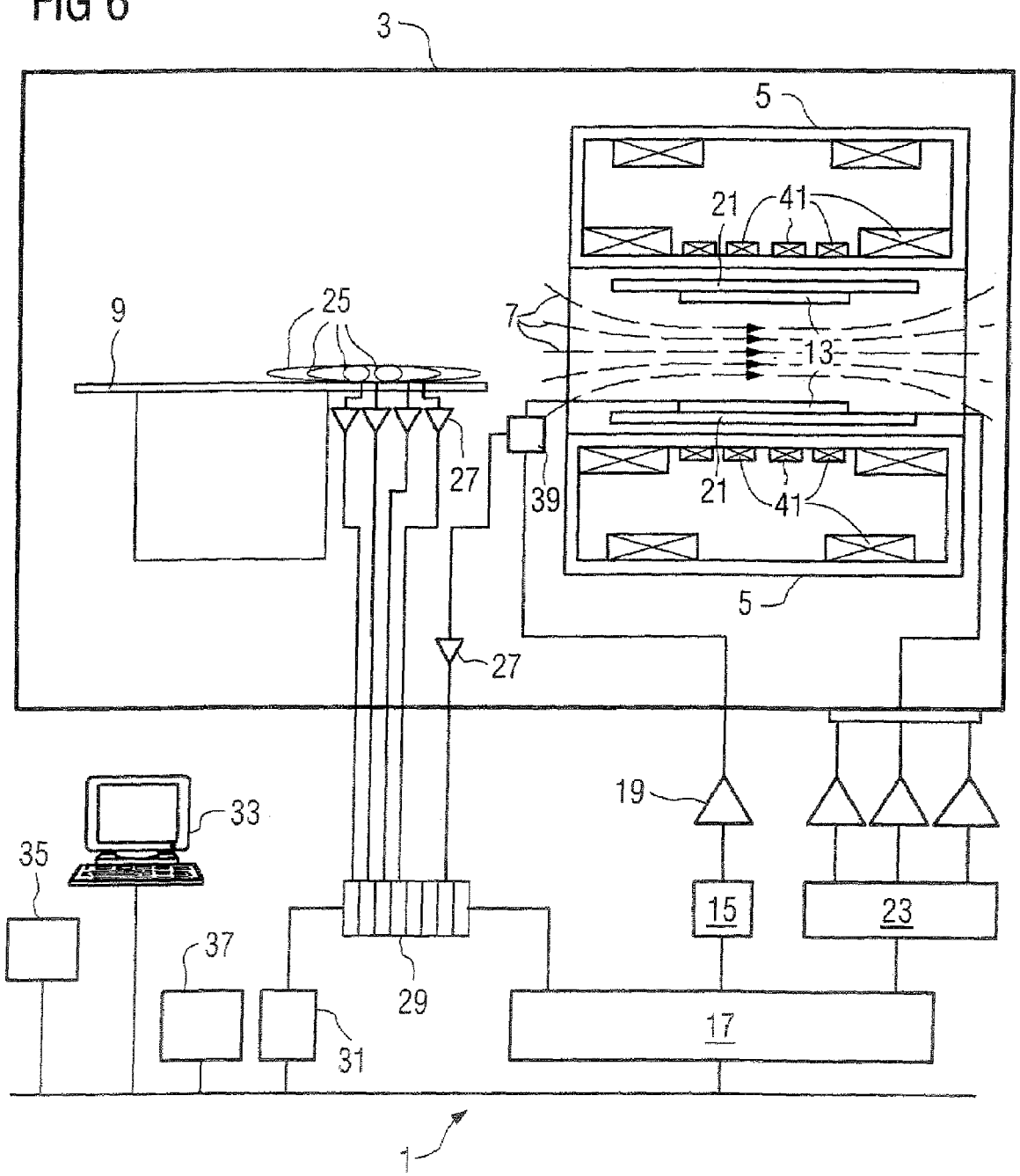
FIG. 6 schematically illustrates a magnetic resonance apparatus with a superconducting magnetic coil produced with the inventive method.

FIG. 6 schematically shows the design of a magnetic resonance apparatus 1. The components of the magnetic resonance apparatus 1 with which the actual measurement is implemented are located in a radio-frequency-shielded measurement compartment 3. In order to examine a body by means of magnetic resonance imaging, various magnetic fields attuned to one another as precisely as possible in terms of their temporal and spatial characteristics are radiated into the body.

A strong magnet (typically a cryomagnet 5 with a tunnel-like opening) generates a strong, static basic magnetic field 7 that typically amounts to 0.2 Tesla to 3 Tesla and more. A body (not shown here) to be examined is placed on a patient bed 9 and positioned inside the basic magnetic field 7. Magnetic coils 41 in the cryomagnet 5 of the magnetic resonance apparatus are used that are produced according to the inventive method. Since the cryomagnet 5 can be produced more cost-effectively with the inventive method, the costs of the entire magnetic resonance apparatus 1 are reduced.

The excitation of the nuclear spins of the body ensues by magnetic radio-frequency excitation pulses that are radiated from a radio-frequency antenna (shown here as a body coil 13). The radio-frequency excitation pulses are generated by a pulse generation unit 15 that is controlled by a pulse sequence control unit 17. After amplification by a radio-frequency amplifier 19, they are supplied to the radio-frequency antenna. The radio-frequency system shown here is only schematically indicated. Typically more than one pulse generation unit 15, more than one radio-frequency amplifier 19 and a number of radio-frequency antennas are used in a magnetic resonance apparatus 1.

Furthermore, the magnetic resonance apparatus 1 has gradient coils 21 with which gradient fields for selective slice excitation and for spatial coding of the measurement signal are radiated during a measurement. The gradient coils 21 are controlled by a gradient coil control unit 23 that, like the pulse generation unit 15, is connected with the pulse sequence control unit 17.

The signals emitted by the excited nuclear spins are acquired by the body coil 13 and/or by local coils 25, amplified by associated radio-frequency preamplifiers 27 and further processed and digitized by an acquisition unit 29.

In the case of a coil that can be operated both in transmission mode and in acquisition (reception) mode (such as, for example, the body coil 13), the correct signal relaying is regulated by an upstream transmission-reception diplexer 39.

An image processing unit 31 generates from the measurement data an image that is shown to a user at an operation console 33 or is stored in a storage unit 35.

A central computer 37 controls the individual system components.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for producing a superconducting magnetic coil, comprising the steps of:
    winding superconducting wires to form a superconducting magnetic coil while applying a UV-curable plastic to said superconducting wires, different portions of said superconducting wires during said winding coming to occupy, due to said winding, respectively different regions of said superconducting magnetic coil being wound; and
    during said winding of said superconducting wires, at least partially curing said UV-curable plastic of the wires that is being wound by exposing at least a portion of said UV-curable plastic to UV light to at least partially cure said UV-curable plastic of the wires that is being wound at respectively different curing speeds in said different regions.

2. The method as claimed in claim 1 comprising employing a UV-curable epoxy resin as said UV-curable plastic.

3. The method as claimed in claim 1 comprising employing a UV-curable plastic filled with a filler material as said UV-curable plastic.

4. The method as claimed in claim 1 comprising winding said superconducting wire on a reusable winding spindle.

5. The method as claimed in claim 1 comprising winding said superconducting wire on a cylindrical coil form.

6. The method as claimed in claim 1 comprising exposing said UV-curable plastic to said UV light during said winding with a UV light source selected from the group consisting of a UV laser and a UV lamp.

7. The method as claimed in claim 1 comprising winding said superconducting wire to form a superconducting magnetic coil of a magnetic resonance apparatus.

8. A magnetic resonance apparatus comprising a superconducting magnetic coil produced according to the method of claim 1.

9. The method as claimed in claim 1 wherein said different regions of said superconducting magnetic coil have respectively different stability requirements, and comprising at east partially curing said UV-curable plastic at said respectively different curing speeds in said different regions to give the cured UV-curable plastic respectively different stabilities in said different regions to respectively satisfy said different stability requirements.

10. A method for producing a superconducting magnetic coil, comprising the steps of:
   winding superconducting wires to form a superconducting magnetic coil while applying at least two different types of UV-curable plastic to said superconducting wires, different portions of said superconducting wires coming to occupy, due to said winding respectively different regions of said superconducting coil;
   applying said at least two different types of UV-curable plastic to said superconducting wires along a length thereof to cause said different portions of said superconducting wires, respectively occupying said different regions of said superconducting coil, to be respectively covered by said two different types of UV-curable plastic; and
   during said winding of said superconducting wires, at least partially curing each of said at least two types of UV-curable plastic of the wires that is being wound by exposing at least a portion of each of said two types of UV-curable plastic to UV light.

11. The method as claimed in claim 10 comprising employing, as said at least two different types of UV-curable plastics, UV-curable plastics respectively having different curing times.

12. The method as claimed in claim 10 comprising employing, as said at least two different types of UV-curable plastics, UV-curable plastics having respectively different filler materials.

13. The method as claimed in claim 10 comprising employing a UV-curable epoxy resin as one of said at least two types of UV-curable plastic.

14. The method as claimed in claim 10 comprising employing a UV-curable plastic filled with a filler material as one of said at least two types of UV-curable plastic.

15. The method as claimed in claim 10 comprising winding said superconducting wire on a reusable winding spindle.

16. The method as claimed in claim 10 comprising winding said superconducting wire on a cylindrical coil form.

17. The method as claimed in claim 10 comprising exposing said UV-curable plastic to said UV light during said winding with a UV light source selected from the group consisting of a UV laser and a UV lamp.

18. The method as claimed in claim 10 comprising winding said superconducting wire to form a superconducting magnetic coil of a magnetic resonance apparatus.

19. A magnetic resonance apparatus comprising a superconducting magnetic coil produced according to the method of claim 10.

20. The method as claimed in claim 10 wherein said different regions of said superconducting magnetic coil have respectively different stability requirements, and comprising at least partially curing said UV-curable plastic at said respectively different curing speeds in said different regions to give the cured UV-curable plastic respectively different stabilities in said different regions to respectively satisfy said different stability requirements.

* * * * *